US010388363B1

(12) United States Patent
Ito

(10) Patent No.: US 10,388,363 B1
(45) Date of Patent: Aug. 20, 2019

(54) APPARATUSES AND METHODS FOR DETECTING A ROW HAMMER ATTACK WITH A BANDPASS FILTER

(71) Applicant: MICRON TECHNOLOGY, INC., Boise, ID (US)

(72) Inventor: Yutaka Ito, Taito-ku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/881,256

(22) Filed: Jan. 26, 2018

(51) Int. Cl.
G11C 11/24 (2006.01)
G11C 11/4099 (2006.01)
G11C 11/408 (2006.01)

(52) U.S. Cl.
CPC ...... *G11C 11/4099* (2013.01); *G11C 11/4085* (2013.01)

(58) Field of Classification Search
CPC .......................... G11C 11/40615; G11C 8/06
See application file for complete search history.

(56) References Cited

U.S. PATENT DOCUMENTS

| | | | |
|---|---|---|---|
| 5,299,159 A | 3/1994 | Balistreri et al. | |
| 5,943,283 A | 8/1999 | Wong et al. | |
| 7,830,742 B2 | 11/2010 | Han | |
| 8,625,360 B2 | 1/2014 | Iwamoto et al. | |
| 8,811,100 B2 | 8/2014 | Ku | |
| 9,032,141 B2 | 5/2015 | Bains et al. | |
| 9,117,544 B2 | 8/2015 | Bains et al. | |
| 9,805,783 B2 | 10/2017 | Ito et al. | |
| 10,032,501 B2 | 7/2018 | Ito et al. | |
| 10,170,174 B1 | 1/2019 | Ito et al. | |
| 2004/0130959 A1 | 7/2004 | Kawaguchi | |
| 2008/0181048 A1 | 7/2008 | Han | |
| 2010/0329069 A1 | 12/2010 | Ito et al. | |

(Continued)

FOREIGN PATENT DOCUMENTS

| | | |
|---|---|---|
| JP | 2005-216429 A | 8/2005 |
| JP | 2011-258259 A | 12/2011 |
| JP | 2013-004158 A | 1/2013 |

OTHER PUBLICATIONS

Kim, et al., "Flipping Bits in Memory Without Accessing Them: An Experimental Study of DRAM Disturbance Errors", IEEE, Jun. 2014, 12 pgs.

(Continued)

*Primary Examiner* — Uyen B Tran
(74) *Attorney, Agent, or Firm* — Dorsey & Whitney LLP

(57) ABSTRACT

Apparatuses and methods for executing row hammer (RH) refresh are described. An example apparatus includes a RH control circuit to provide a row hammer address, and a refresh control circuit to perform a RH refresh operation on a memory address array related to the RH address. The RH control circuit includes first latches each to store an old row address used to access the memory and second latches provided correspondingly to the first latches each set to a state indicating whether the old row address stored in one of the first latches is valid. The RH control circuit further including a signal generator configured to assert a sample signal when a new row address to be used to access the memory array matches the old row address stored in any one of the first latches is valid based on a state of one of the second latches.

13 Claims, 9 Drawing Sheets

(56) References Cited

U.S. PATENT DOCUMENTS

| | | |
|---|---|---|
| 2011/0310648 A1 | 12/2011 | Iwamoto et al. |
| 2014/0006703 A1 | 1/2014 | Bains et al. |
| 2014/0006704 A1 | 1/2014 | Greenfield et al. |
| 2014/0095786 A1 | 4/2014 | Moon et al. |
| 2014/0237307 A1 | 8/2014 | Kobla et al. |
| 2014/0241099 A1 | 8/2014 | Seo et al. |
| 2014/0281206 A1 | 9/2014 | Crawford et al. |
| 2015/0089326 A1 | 3/2015 | Joo et al. |
| 2015/0213872 A1 | 7/2015 | Mazumder et al. |
| 2015/0255140 A1 | 9/2015 | Song |
| 2015/0294711 A1 | 10/2015 | Gaither et al. |
| 2016/0086649 A1 | 3/2016 | Hong et al. |
| 2016/0125931 A1 | 5/2016 | Doo et al. |
| 2016/0196863 A1 | 7/2016 | Shin et al. |
| 2017/0263305 A1 | 9/2017 | Cho |
| 2017/0287547 A1 | 10/2017 | Ito et al. |
| 2018/0005690 A1* | 1/2018 | Morgan ............ G11C 11/40615 |
| 2018/0025770 A1 | 1/2018 | Ito et al. |
| 2018/0182445 A1* | 6/2018 | Lee ......................... G11C 8/04 |
| 2018/0261268 A1* | 9/2018 | Hyun ................... G11C 7/1087 |
| 2018/0308539 A1 | 10/2018 | Ito et al. |
| 2019/0122723 A1 | 4/2019 | Ito et al. |

OTHER PUBLICATIONS

U.S. Appl. No. 16/020,863, titled "Semiconductor Device", filed Jun. 27, 2018, pp. all.

U.S. Appl. No. 16/237,291, titled "Apparatus and Methods for Refreshing Memory", filed Dec. 31, 2018.

U.S. Appl. No. 16/386,775 titled "Apparatuses and Methods for Random Signal Generation", filed Apr. 17, 2019.

* cited by examiner

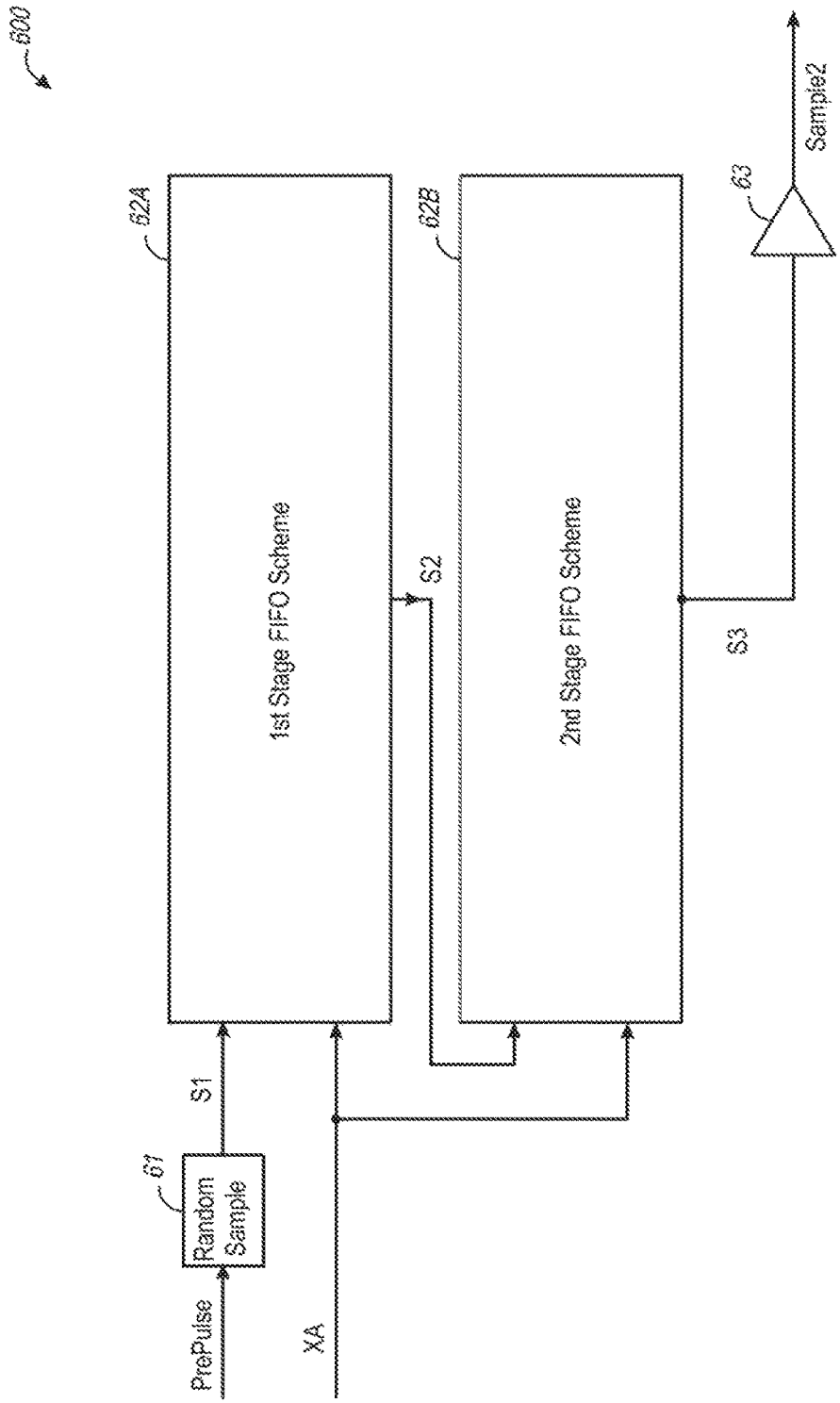

APPARATUSES AND METHODS FOR DETECTING A ROW HAMMER ATTACK WITH A BANDPASS FILTER

BACKGROUND

High data reliability, high speed of memory access, and reduced chip size are features that are demanded from semiconductor memory.

A dynamic random access memory (DRAM), which is a typical semiconductor memory device, stores information by charges accumulated in cell capacitors, and, therefore, the information is lost unless refresh operations are periodically carried out. In addition to normal memory cell retention characteristics, as the density of DRAM cells has increased, certain access patters may further reduce retention time, thereby leading to data becoming corrupted. Such a problem has been exposed in DRAM devices, by repeatedly accessing (i.e., hammering) a row of memory, commonly referred to as a row hammer. A row hammer causes adjacent rows of memory to become susceptible to accelerated loss of data, as compared with a normal access operation of the memory. Some conventional solutions have been implemented to detect a likely row hammer of a target row, and initiate a refresh of rows that are adjacent to the target row. As row hammer attacks become more sophisticated, such as employing a higher frequency decoy attack to mask lower frequency targeted attack, conventional row hammer detection circuitry is susceptible to overlooking these more sophisticated attacks.

BRIEF DESCRIPTION OF THE DRAWINGS

FIGS. 6A-6C are block diagrams of different embodiments of multi-stage, act-based sampling circuits, respectively, in accordance with some embodiments of the disclosure.

DETAILED DESCRIPTION OF PREFERRED EMBODIMENTS

Various embodiments of the disclosure will be explained below in detail with reference to the accompanying drawings. The following detailed description refers to the accompanying drawings that show, by way of illustration, the manner in which specific aspects and embodiments may be practiced. Sufficient detail is described to enable those skilled in the art to practice embodiments of the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

Figure 1:
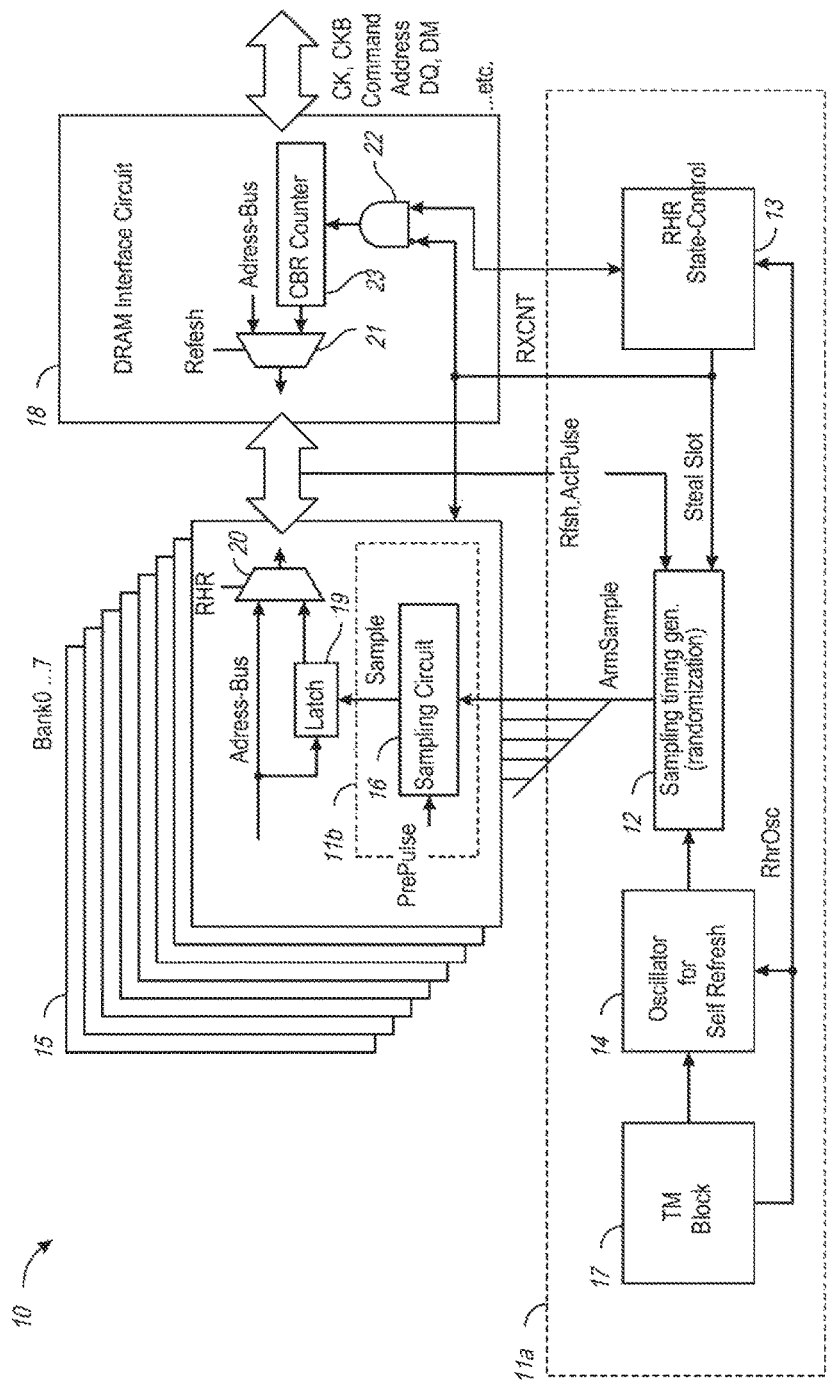
FIG. 1 is a block diagram of a semiconductor device including a refresh control circuit in accordance with some embodiments of the disclosure.

FIG. 1 is a block diagram of a semiconductor device 10 including a refresh control circuit 11 in accordance with some embodiments of the disclosure. The semiconductor device 10 may be an LPDDR4 SDRAM integrated into a single semiconductor chip, for example. The semiconductor device 10 may include a plurality of memory banks 15, and a DRAM interface circuit 18. A refresh control circuit 11 may include a common circuit 11a shared by the plurality of memory banks 15 banks and a refresh control circuit 11b including a hybrid sampling circuit 16 and a latch 19 per bank provided in each bank of the plurality of memory banks 15. The hybrid sampling circuit 16 includes time-based sampling circuitry that is responsive to the ArmSample signal and act-based sampling circuitry that is responsive to an activation signal PrePulse. The DRAM interface 18 may receive and transmit clock signals, command signals, address signals and data signals, etc.

The common circuit 11a may include a sampling timing generator circuit 12 and an RHR state-control circuit 13. For example, the sampling timing generator circuit 12 may be provided for the plurality of memory banks 15 or for each memory bank of the plurality of memory banks 15 (e.g., Bank0, . . . Bank7). For example, the RHR state-control circuit 13 may receive an RXCNT signal from the DRAM interface circuit 18. In some examples, the RXCNT signal may be provided at an end of each refresh operation. The RHR state-control circuit 13 may count responsive to the RXCNT signal in an active state, and may provide an instruction signal StealSlot for executing row hammer refresh (RHR) instead of normal refresh based on the RHR steal rate signal. The sampling timing generator circuit 12 may receive the instruction signal StealSlot from the RHR state-control circuit 13 and may further receive a frequency-divided RHR oscillation signal (RhrOsc) from an oscillator block 14 for self-refresh. The sampling timing generator circuit 12 may provide a trigger signal for sampling (ArmSample) to a sampling circuit 16 of each memory bank of the plurality of memory banks 15 (e.g., Bank0, . . . Bank 7) at a random timing. The ArmSample signal may be randomized by randomization of a frequency of the activation of the ArmSample signal and a RHR steal rate. In some examples, the common sampling circuit 11a may further include a TM block 17 that is configured to provide the RHR steal rate signal indicating an interval of RHR execution.

Responsive to the ArmSample signal (e.g., time-based) and/or the PrePulse signal (e.g., act-based), the hybrid sampling circuit 16 may provide a sampling signal (Sample). A latch circuit 19 (e.g., including latches, flip-flops, etc.) of each memory bank of the plurality of memory banks 15 (e.g., Bank0, . . . Bank7) may capture (e.g., latch) a row (X) address responsive to the sampling signal (Sample), an adjacent address of the row address may be calculated and provided as an RHR refresh address to a multiplexer 20 in response to the Sample signal. The multiplexer also receives an address from the address bus, and in response to a RHR signal, provides one of the address from the address bus or the RHR steal address from the latch circuit 19. For example, the hybrid sampling circuit 16 may provide the sampling signal (Sample) a plurality of times in the interval of RHR execution and the captured address may be overwritten each time, and an adjacent address of the address most recently captured becomes a valid address that is to be finally applied to the RHR refresh address and provided as an address to the DRAM interface circuit 18 that handles clock signals, command signals, address signals and data signals. The DRAM interface circuit 18 includes a column-select (CAS) before row-select (RAS) counter (CBR counter) 23 that maintains which address is to be refreshed during a normal refresh. The CBR counter 23 is clocked by the RXCNT signal when the StealSlot signal is not set (using the AND gate 22 logic). The DRAM interface circuit 18 provides one of an address on an address bus or the output of the CBR counter 23 in response to a refresh command.

Figure 2:
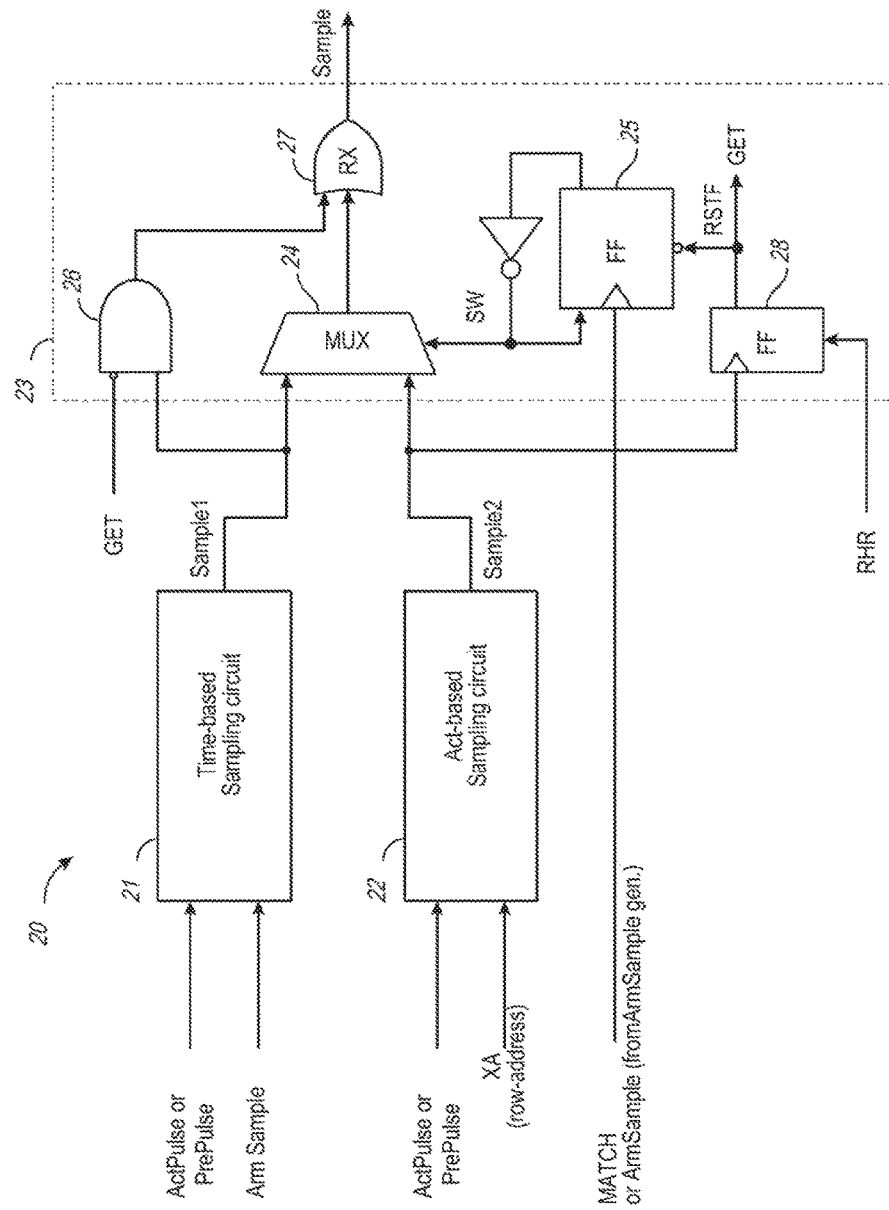
FIG. 2 is a schematic diagram of a hybrid sampling circuit in accordance with some embodiments of the disclosure.

FIG. 2 is a schematic diagram of a hybrid sampling circuit 20 in accordance with some embodiments of the disclosure. The hybrid sampling circuit 16 of FIG. 1 may implement the hybrid sampling circuit 20. The hybrid sampling circuit 20 may include a time-based sampling circuit 21, an act-based sampling circuit 22, (e.g., an act-based sampling circuit based on Act command), and a mixing circuit 23. The time-based sampling circuit 21 may be implemented in the bank sampling circuit 11*b* in FIG. 1 that receives either ActPulse or PrePulse signal responsive to either Act command or Precharge command and the trigger signal for sampling (ArmSample), and provides a sampling signal (Sample1). The act-based sampling circuit 22 may be implemented in another sampling circuit in the semiconductor device 10 of FIG. 1, which may receive a command based pulse signal such as the ActPulse signal or the PrePulse signal and a row address (XA) for the command and provides a sampling signal (Sample2). The mixing circuit 23 may include a multiplexer 24, a latch circuit (e.g., a flip-flop) 25, an AND gate 26, an OR gate 27, and a flip-flop 28. The match signal (or ArmSample signal) may be in the active state once at a randomized timing within the interval for executing row hammer refresh.

The latch circuit 25 may receive the match signal at a clock input and may provide an inversion of the match signal to the multiplexer 24 as a switch signal SW as well as a data input node of the latch circuit 25 to reset the latch circuit 25. Thus, the multiplexer 24 may provide either the sampling signal (Sample1) from the time-based sampling circuit 21 or the sampling signal (Sample2) from the act-based sampling circuit 22 responsive to the switch signal SW. The Sample signal may be provided from the OR gate 27 based on the output of the multiplexer 24 and the output of the AND gate 26. The AND gate 26 provides the Sample1 signal when the GET signal is inactive. Otherwise, the AND gate 26 provides an inactive signal. The flip-flop 28 may set the GET signal active in response to the Sample2 signal based on the high input to the flip-flop 28. The latch 25 is held in a reset state in response to the GET signal being inactive. The flip-flop 28 may be reset in response to an RHR signal.

Therefore, during a first period, while the GET signal is low, the latch 25 is held in a reset state and the multiplexer 24 connects to the Sample2 signal provided from the command-based sampling circuit 22. Further in response to the GET signal being low, the AND gate 26 provides the Sample1 signal at an output, and the OR gate 27 provides the Sample1 signal at an output when it transitions to a high logical value.

During a second period, the Sample2 signal transitions to active. Because the multiplexer 25 is connected to the Sample2 side, the active Sample2 signal is transferred to the Sample signal via the OR gate 27. The transition of the Sample2 signal to active clocks the flip-flop 28, which may causes the reset of the latch 25 to release. The release of the reset to the latch 25 allows the latch 25 to begin inverting its output in response to the match signal. Therefore, in response to the output of the latch 25 oscillating (in response to the match signal), the multiplexer 24 oscillates its output from the Sample1 signal to the Sample2 signal. In response to the GET signal being active, the AND gate 26 is disabled. Therefore, when the GET signal is active, the Sample signal oscillates between providing the Sample1 signal and the Sample2 signal via the multiplexer 24 in response to the match signal.

During a third period, the RHR signal becomes active, and an RHR operation is performed. In response to the RHR signal becoming active, the flip-flop 28 is reset and the GET signal becomes inactive. The inactive GET signal enables the AND gate 26 and disables the latch 25, which brings the mixing circuit 23 back to the same state during the first period, which includes providing the Sample1 signal at an output as the Sample signal via the AND gate 26 and OR gate 27.

Figure 3:
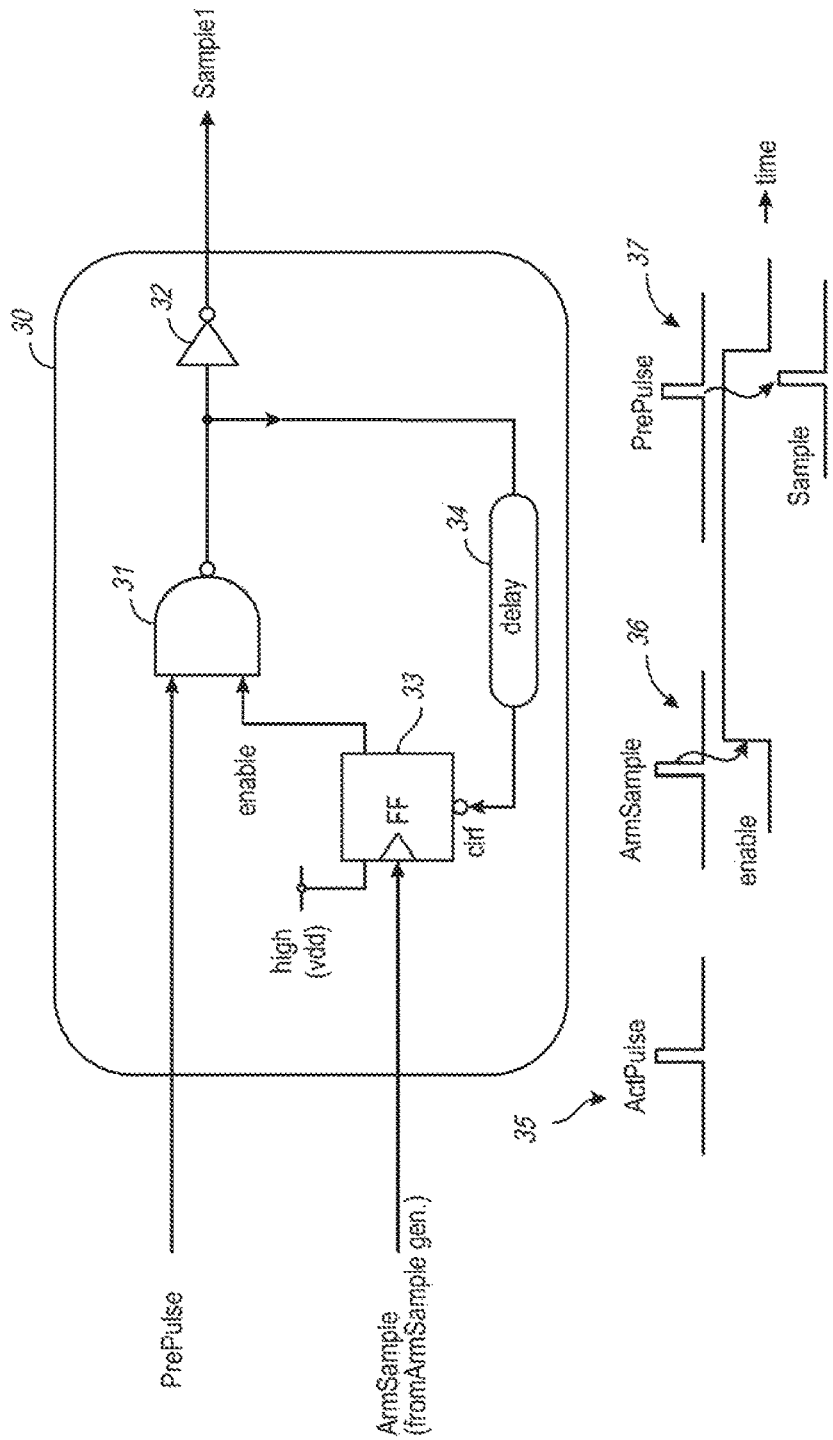
FIG. 3 is a schematic diagram of a time-based sampling circuit in accordance with some embodiments of the disclosure.

FIG. 3 is a schematic diagram of a time-based sampling circuit 30 in accordance with some embodiments of the disclosure. The time-based sampling circuit 21 of FIG. 2 may implement the time-based sampling circuit 30. The time-based sampling circuit 30 includes a NAND gate 31, a flip-flop 33, a delay 34 and an inverter 32. Based on the high input, the flip-flop provides an active enable signal to the NAND gate 31 in response to an ArmSample signal (e.g., refer to time 36 of timing diagram). When the enable signal is active, the NAND gate 31 passes the an inverted PrePulse signal to the inverter 32, which inverts the output of the NAND gate 31 to provide the Sample1 signal (e.g., refer to time 37 of timing diagram). The delay 34 provides the output of the NAND gate 31 to reset the enable signal output from the flip-flop 33 when the enable signal is active and the PrePulse signal toggles to active.

Figure 4:
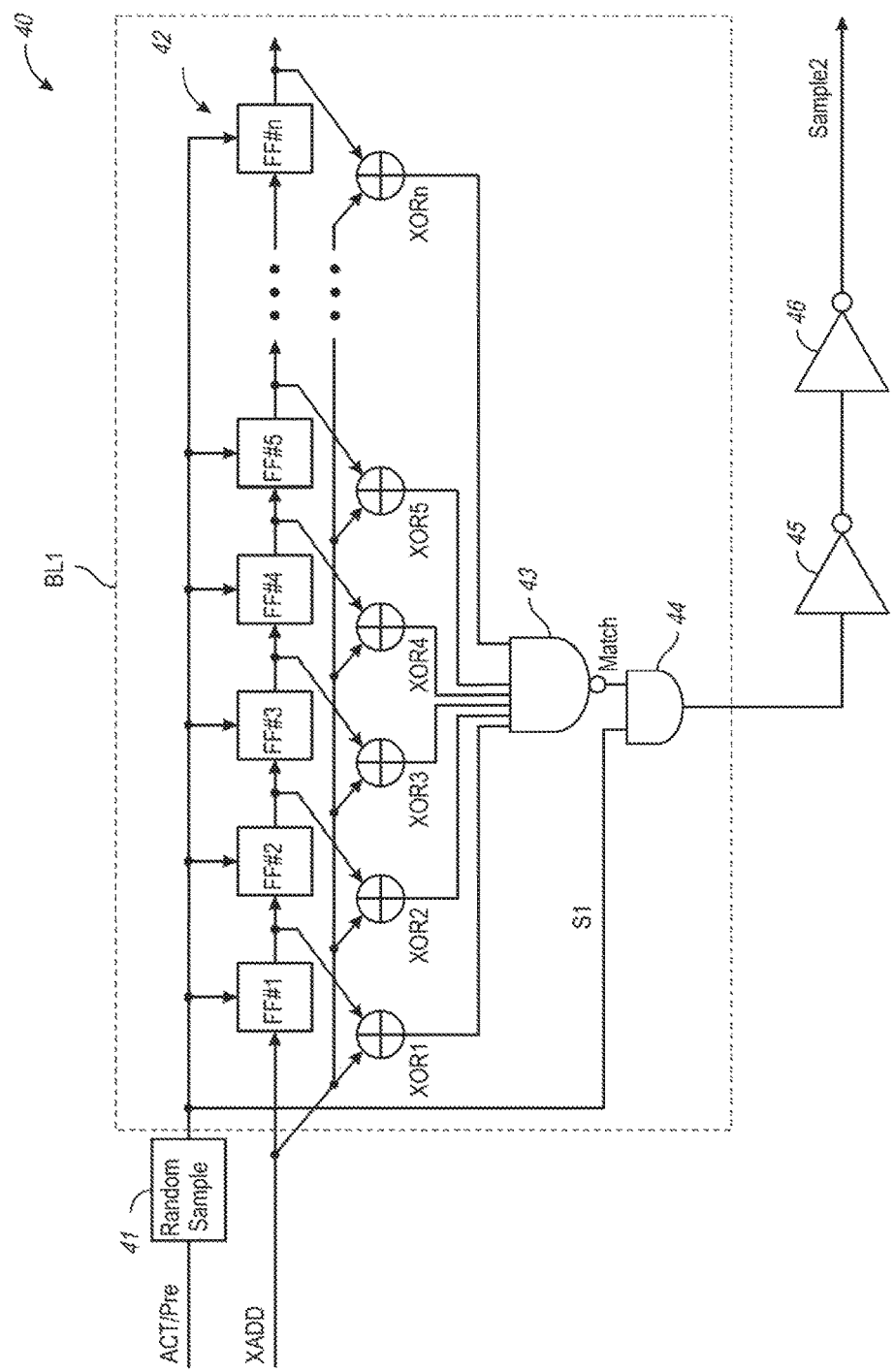
FIG. 4 is a block diagram showing a configuration of a single-stage, act-based high-pass sampling circuit in accordance with some embodiments of the disclosure.

FIG. 4 is a block diagram showing a configuration of a single-stage, act-based high-pass sampling circuit (high-pass sampling circuit) 40 in accordance with some embodiments of the disclosure. The act-based sampling circuit 22 of FIG. 2 may implement the high-pass sampling circuit 40.

As shown in FIG. 4, the high-pass sampling circuit 40 is provided with a random sample signal generator 41, which generates a first sampling signal S1, and a shift register 42, which carries out shift operations synchronized with the first sampling signal S1.

The sampling signal generator 41 randomly extracts the PrePulse signal, which is generated in response to an active command or a pre-charge command, and outputs the signal as a first sampling signal S1. Meanwhile, the random extraction is configured so that an optimum sampling rate with which the reliability of Row Hammer refresh is the highest is present depending on the appearance frequency of hammer addresses and the number of stages (depth) of the shift register 42 and that desired reliability is obtained. The sampling signal generator 41 can generate the first sampling signal S1 by using a pseudo-random generator and a counter circuit, which may be clocked by, for example, the active signal ACT.

Herein, it may be desirable to impart randomness and support all the appearance patterns of hammer addresses. The optimum sampling rate described above is merely a mean value. For example, a case that a hammer address periodically appears at a rate of one time per 50 active commands and that the depth of the shift register 242 provided in the high-pass sampling circuit 40 is 4 is taken into consideration. Herein, if the sampling rate of the first sampling signal S1 is 1 (if all the row addresses are to be retrieved into the shift register 42), the number of the retrieved addresses is extremely large, and, therefore, many match signals are generated (by randomly appearing row addresses). Hammer addresses are reliably retrieved into the shift register 42; however, since the window width for capturing row addresses is only 4, the matching signal "match" is not enabled by hitting the hammer addresses. Even if the sampling rate is somewhat increased to 2 or 3, this situation is not changed. Meanwhile, if the sampling rate is largely increased to 25 (a fixed value), the window width for capturing row addresses is expanded to 100, and results in a situation in which the match signal may be enabled by hitting the hammer addresses. Also, since there is a relation that the appearance frequency of hammer addresses is exactly two times the sampling rate, the hit rate thereof may become extremely high probability as if synchronization with hammer address has occurred. However, since they have a periodic appearance pattern and a constant sampling rate, hit may never occur as if mis-synchronization has occurred. If the appearance pattern of hammer addresses is random (even with a constant sampling rate), probabilistically, hammer addresses may be hit, but not always. Therefore, it is important to carry out random sampling to enable capturing of the hammer addresses having various appearance patterns. Herein, furthermore, a case in which the sampling rate is 100, which is large, is taken into consideration. The window width for capturing row-address becomes 400, which is eight times the appearance frequency of hammer addresses. The hammer addresses can be captured by carrying out random sampling, and the capture probability thereof (hit rate) can be also increased by providing the shift register 42 like the refresh address control circuit (FIG. 4). However, if the sampling rate is excessively increased, the number of times per se of capturing the hammer addresses is reduced since the number of active commands which can be entered within a refresh cycle has an upper limit. This is disadvantageous to increase reliability. Reversely, if the sampling rate is too small, as described above, the number of times of capturing thereof increases; however, the capture probability (hit rate) decreases. Thus, the end reliability is determined by a product of "the hammer's hit rate" and "the number of times of capturing hammer address", therefore, the sampling rate has an optimum value with which reliability is the highest according to the balance of them. In order to exert performance by the refresh address control circuit 200, the first sampling signal S1 is extremely important.

The shift register 42 has a configuration in which n-stages of flip-flop circuits FF#1 to FF#n, which latch the row addresses XADD, are in cascade connection. In other words, an output node of the flip-flop circuit of a former stage is connected to an input node of the flip-flop circuit of a later stage. The first sampling signal S1 is commonly input to clock nodes of the flip-flop circuits FF#1 to FF#n. As a result, when the first sampling signal S1 is activated, the current row address XADD is latched by the flip-flop circuit FF#1 of a first stage, and the row addresses XADD latched by the flip-flop circuits FF#1 to FF#n−1 are respectively shifted to the flip-flop circuits FF#2 to FF#n of next stages. The row address XADD latched by the flip-flop circuit FF#n, which is a last stage, is discarded in response to activation of the first sampling signal S1.

The row addresses XADD latched by the flip-flop circuits FF#1 to FF#n are supplied to first-side input nodes of corresponding comparator circuits XOR1 to XORn, respectively. The current row address XADD is supplied to second-side input nodes of the comparator circuits XOR1 to XORn. As a result, if the current row address XADD matches any of the row addresses XADD latched by the flip-flop circuits FF#1 to FF#n, the output of the comparator circuit XOR1 to XORn thereof is activated to a low level, and, therefore, the match signal Match output from a NAND gate circuit 43 is activated to a high level.

The match signal Match and the first sampling signal S1 are supplied to an AND gate circuit 44. Therefore, if both of the match signal Match and the first sampling signal S1 are activated to the high level, a second sampling signal S2 output from the AND gate circuit 44 is activated to the high level. More specifically, if the row address XADD supplied when the first sampling signal S is activated within past n-times matches the row address XADD supplied when the first sampling signal S1 is currently activated, the second sampling signal S2 is activated. In other words, the access to the word lines WL is intermittently monitored, and, if the access to the same word line WL is captured two times or more within a predetermined period of time, the second sampling signal S2 is activated.

The second sampling signal S2 is supplied through a series of inverters 45 and 46 to drive the S2 signal as the Sampling2 signal. While the high-pass sampling circuit 40 of FIG. 4, in combination with a time-based sampling circuit, is proficient at catching higher frequency row hammer attacks, but is more of a high-pass filter than generally only catches the most high frequency attacks. Consequently, in some instances, the high-pass sampling circuit 40 may be susceptible to attacks where dual row hammer attacks are engaged contemporaneously, with a higher frequency attack acting as a decoy to allow a lower frequency attack of an intended target row.

Figure 5A:
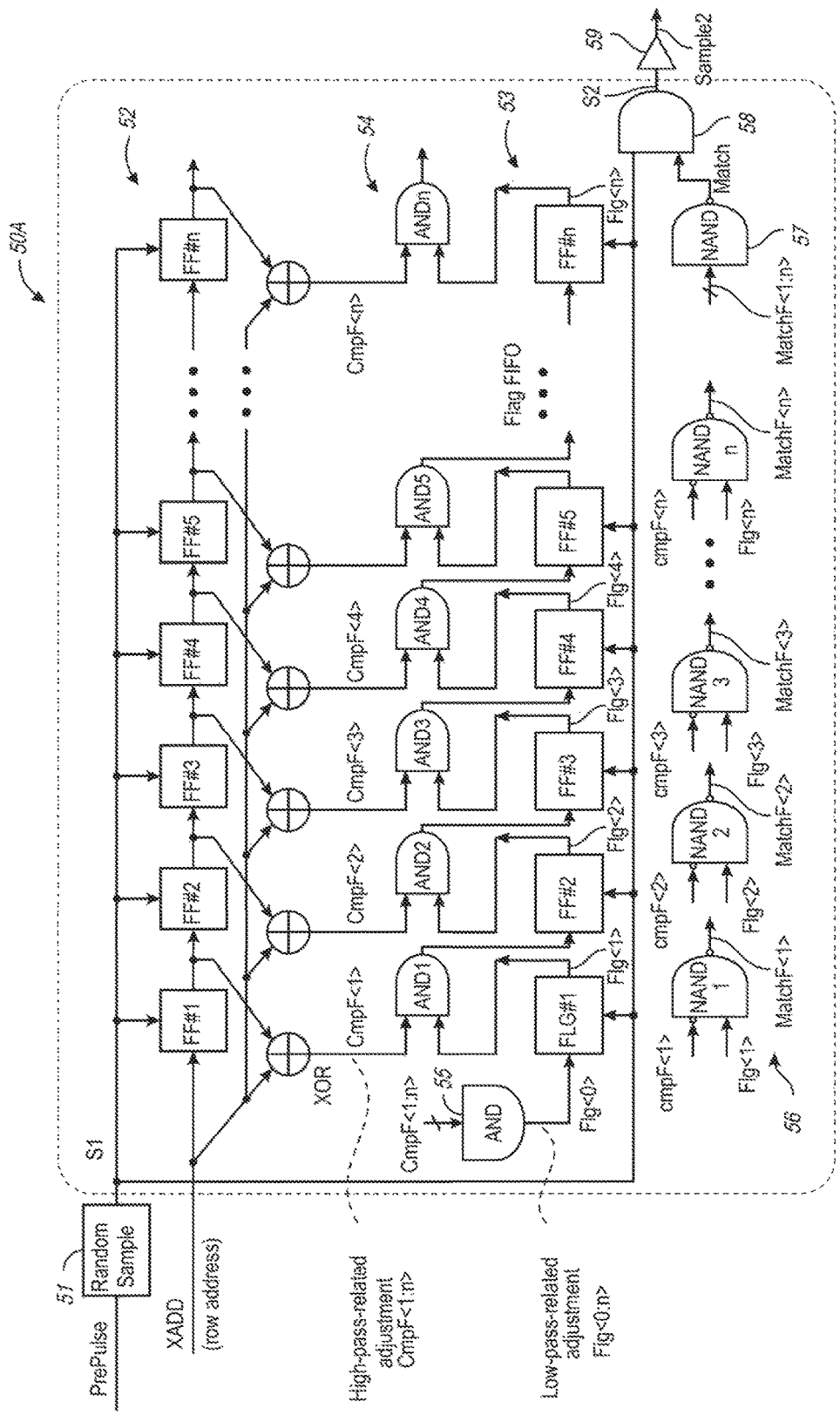
FIG. 5A is a block diagram showing a first configuration of a single-stage, act-based bandpass sampling circuit in accordance with some embodiments of the disclosure.

FIG. 5A is a block diagram showing a first configuration of a single-stage, act-based bandpass sampling circuit (bandpass sampling circuit) 50A in accordance with some embodiments of the disclosure. The act-based sampling circuit 22 of FIG. 2 may implement the bandpass sampling circuit 50A.

As shown in FIG. 5A, an example of a bandpass sampling circuit 50A is provided with a random sample signal generator 51, which generates a first sampling signal S1, and a shift register 52, which carries out shift operations synchronized with the first sampling signal S1.

The sampling signal generator 51 randomly extracts the PrePulse signal, which is generated in response to an active command or a pre-charge command, and outputs the signal as a first sampling signal S1. Meanwhile, the random extraction is configured so that an optimum sampling rate with which the reliability of Row Hammer refresh is the highest is present depending on the appearance frequency of hammer addresses and the number of stages (depth) of the shift register 52 and that desired reliability is obtained. The sampling signal generator 51 can generate the first sampling signal S1 by using a pseudo-random generator and a counter circuit, which may be clocked by, for example, the active signal ACT.

The shift register 52 has a configuration in which n-stages of flip-flop circuits FF#1 to FF#n, which latch the row addresses XADD, are in cascade connection. In other words, an output node of the flip-flop circuit of a former stage is connected to an input node of the flip-flop circuit of a later stage. The first sampling signal S1 is commonly input to clock nodes of the flip-flop circuits FF#1 to FF#n. As a result, when the first sampling signal S1 is activated, the current row address XADD is latched by the flip-flop circuit FF#1 of a first stage, and the row addresses XADD latched by the flip-flop circuits FF#1 to FF#n-L are respectively shifted to the flip-flop circuits FF#2 to FF#n of next stages. The row address XADD latched by the flip-flop circuit FF#n, which is a last stage, is discarded in response to activation of the first sampling signal S1.

The row addresses XADD latched by the flip-flop circuits FF#1 to FF#n are supplied to first-side input nodes of corresponding comparator circuits XOR1 to XORn, respectively. The current row address XADD is supplied to second-side input nodes of comparator circuits XOR1 to XORn. As a result, if the current row address XADD matches any of the row addresses XADD latched by the flip-flop circuits FF#1 to FF#n, the output of the comparator circuit XOR1 to XORn thereof is activated to a low level, and, therefore, the respective inverted compare signal CmpF<1:n> signal.

The inverted compare signal CmpF<1:n> signal are supplied to a first input node of comparator circuits AND1 to ANDn 54. The bandpass sampling circuit 50A further includes flag circuits FLG#1 to FLG#n 55 that each receive an input from one respective AND1 to AND gate 55 and, in response to the S1 signal, to propagate the input value to the output as a respective FLG<1:n> signal, which is provided to a second input node of a subsequent AND1 to ANDn gate 55. The bandpass sampling circuit 50A further includes an AND gate 55 that provides an initial input FLG<0> signal to the FLG#1 circuit based on the collective values of the CmpF<1:n> signals. For example, in response to an XADD matching a value one of the CmpF<1:n> signals transitions low, causing the Flg<0> signal from the output of the AND gate 55 to transition low. In response to the S1 signal, the FF#L will latch the XADD value and the Flg#1 will latch a logically low value. These values will propagate together through the rest of the FF#2 to FF#n to Flg#2 circuits with each transition of the S1 signal. If the XADD does not match an address latched in any of the flip-flops FF#1 to FF#n, then the Flg<0> values remains high, and a high FLG<1:n> propagates with the stored XADD value.

The bandpass sampling circuit 50A further includes NAND1 to NANDn gates 56 that each compare a respective inverted CmpF<1:n> signal with a respective Flg<1:n> signal to provide a respective matchF<1:n> signal. Therefore, a respective matchF<1:n> signal will transition low when a corresponding Flg<1:n> signal is high (e.g., indicating no previous match for the XADD value stored in the corresponding flip-flop FF#1 to FF#n) and the CmpF<1:n> signal is low (e.g., indicating a match between the current XADD value and the XADD value stored in the corresponding flip-flop FF#1 to FF#n). Otherwise, the respective matchF<1:n> signal will remain high. The matchF<1:n> signals are collectively provided to a NAND gate 57. If all of the matchF<1:n> signals are high (e.g., indicating no match or an XADD that has already been matched), then the NAND gate 57 provides a match signal having a low value. In response to the S1 signal being high and the match signal being low, the AND gate 58 provides the S2 signal as a low value to the driver 59, which provides the Sample2 signal based on the S2 signal. If any of the matchF<1:n> signals are low, the match signal toggles high, and causing the S2 signal to toggle high via the AND gate 58, which causes the Sample2 signal to toggle high. To summarize, the combination of the Flg#1 to Flg#n circuits 55, the NAND1 to NANDn gates 56, and the NAND gate 57 prevent an XADD value from being repeatedly refreshed as it propagates through the flip-flops FF#1 to FF#n, which may allow less frequent XADD values to be refreshed. In some examples, the time-based sampling circuit may compensate suppression of refreshes of the highest frequency XADD addresses by the bandpass sampling circuit 50A.

The match signal Match and the first sampling signal S1 are supplied to an AND gate circuit 44. Therefore, if both of the match signal Match and the first sampling signal S1 are activated to the high level, a second sampling signal S2 output from the AND gate circuit 44 is activated to the high level. More specifically, if the row address XADD supplied when the first sampling signal S1 is activated within past n-times matches the row address XADD supplied when the first sampling signal S1 is currently activated, the second sampling signal S2 is activated. In other words, the access to the word lines WL is intermittently monitored, and, if the access to the same word line WL is captured two times or more within a predetermined period of time, the second sampling signal S2 is activated.

Figure 5B:
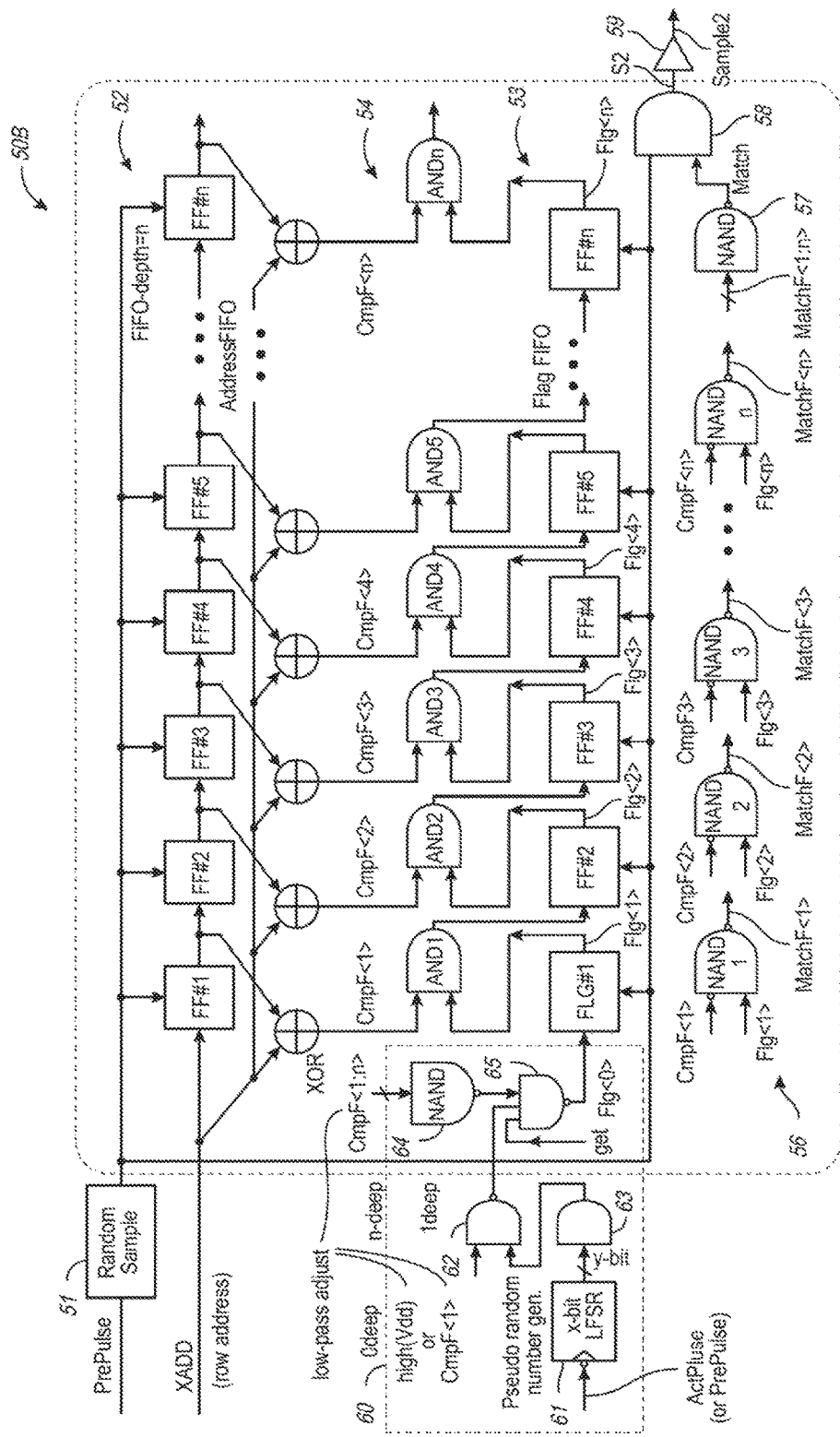
FIG. 5B is a block diagram showing a second configuration of a single-stage, act-based bandpass sampling circuit in accordance with some embodiments of the disclosure.

FIG. 5B is a block diagram showing a second configuration of a single-stage, act-based bandpass sampling circuit (bandpass sampling circuit) 50B in accordance with some embodiments of the disclosure. The act-based sampling circuit 22 of FIG. 2 may implement the bandpass sampling circuit 50B. The bandpass sampling circuit 50B may use many of the same components that are illustrated in the bandpass sampling circuit 50A of FIG. 5A, and they may operate in a substantially similar manner. Therefore, in the interests of brevity and clarity, an explanation of the function and operation of these common components will not be repeated.

As shown in FIG. 5B, an example of the bandpass sampling circuit 50B is provided with a filter circuit 60 that controls when the Flg<0> signal is set low. The filter circuit includes a linear-feedback shift register (LFSR) 61 that is clocked in response to an ActPulse or PrePulse signal to provide y-bit signals to an AND gate 63. The filter circuit further includes a NAND gate 62 configured to receive an output of the AND gate 63 (e.g., an enable signal) and either a high input or the CmpF<1> signal at a second input, and to provide an output to a NAND gate 65. The filter circuit 60 further includes a NAND gate 64 configured to receive the CmpF<1:n> signals and to provide an output to the NAND gate 65. The NAND gate 65 is further configured to receive a get signal (e.g., the get signal of FIG. 2). Based on the output of the NAND gate 64, the output of the NAND gate 62, and the get signal, the NAND gate 65 is configured to provide the Flg<0> signal to the Flg #1 circuit. Therefore, in operation, the filter circuit 60, via the NAND gate 65 filters out second matches when the get signal is low (e.g., first filter) and when the LFSR 63 randomly causes the output of the NAND gate 62 to toggle high (e.g., second filter). Thus, the act-based sampling circuit allows some subsequent matches of XADD values to results in a refresh, which the bandpass sampling circuit 50A of FIG. 5A filters out all subsequent matches of an XADD value.

The high-pass sampling circuit 40 of FIG. 4 acts as a high-pass filter which filters out the highest frequency attacks, but leaves the semiconductor device susceptible to lower frequency attacks. By filtering out some of the higher frequency attacks, the bandpass sampling circuit 50A of FIG. 5A and the bandpass sampling circuit 50B of FIG. 5B may limit an impact of high frequency attacks dominating the act-based detection and increase a chance of detecting attacks at a lower frequency. To mitigate the effect of cutting off high frequency attacks, the row hammer detection circuits may employ the hybrid sampling circuit 20 of FIG. 2 that includes both a time-based sampling circuit 21 working alongside the act-based sampling circuit 22, to capture the higher frequency attacks eliminated by the act-based bandpass sampling circuits 50A and 50B of FIGS. 5A and 5B, respectively.

Figure 6B:
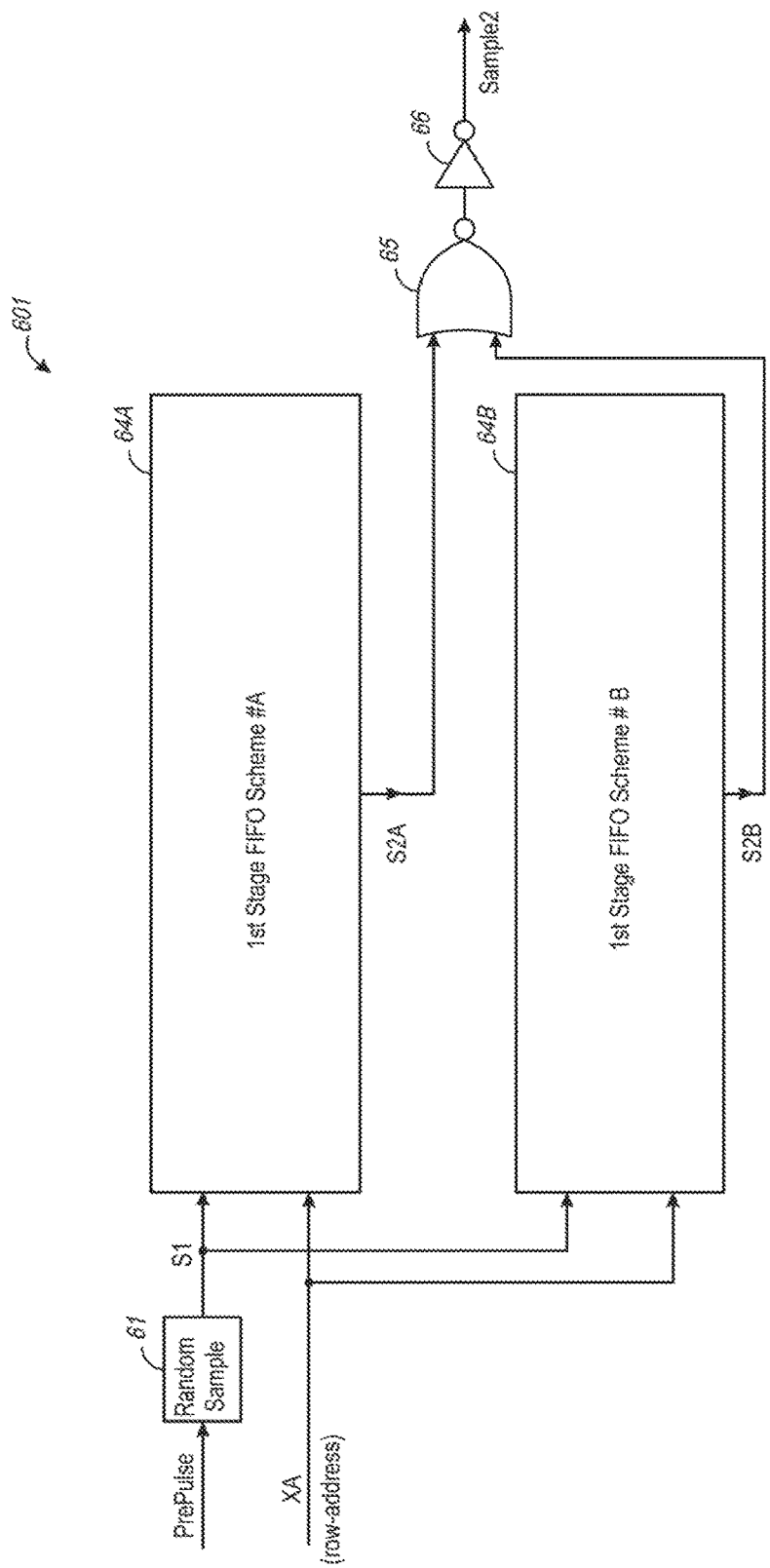
Figure 6C:
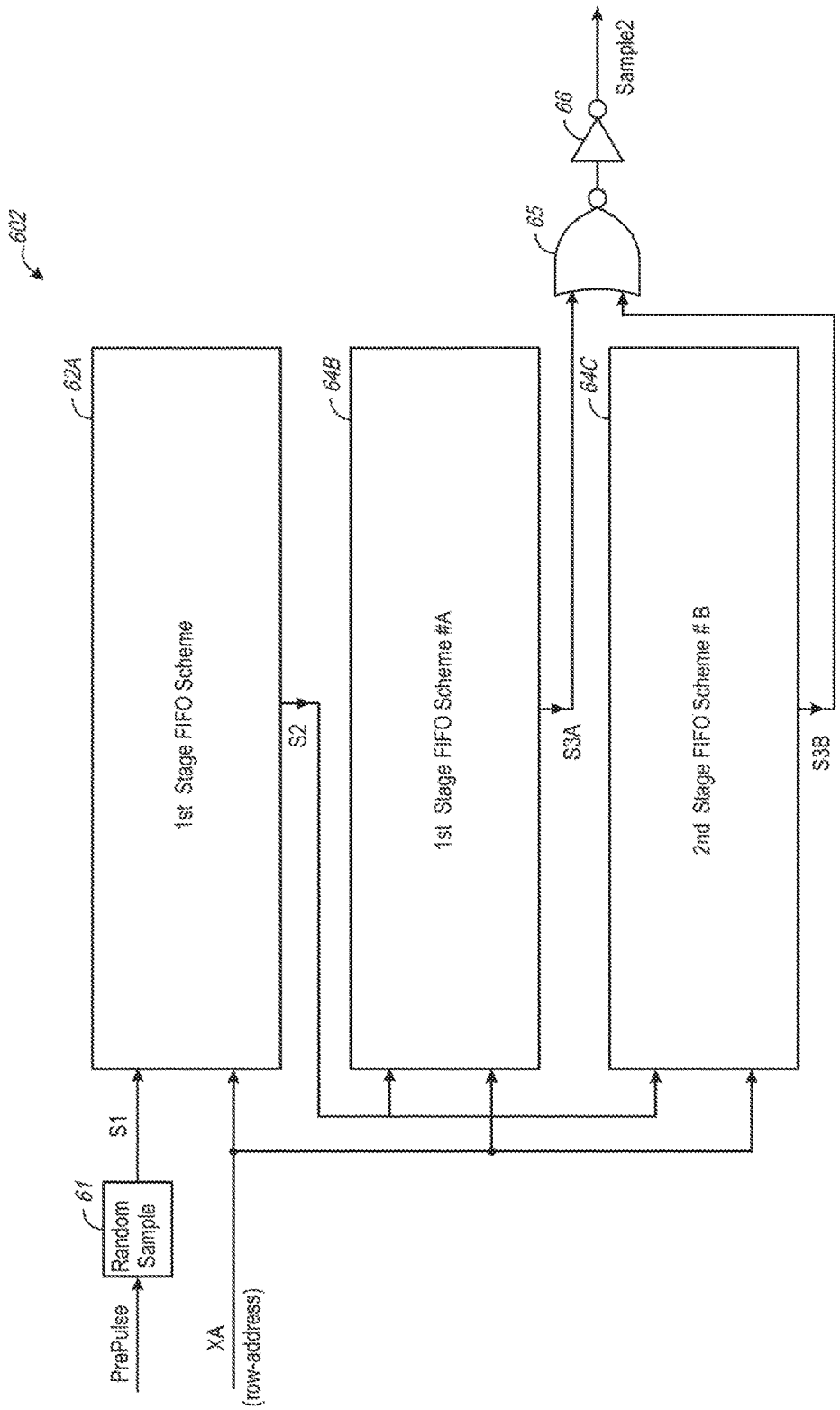

FIGS. 6A-6C are block diagrams of different embodiments of multi-stage, act-based sampling circuits 600, 601, and 602, respectively, in accordance with some embodiments of the disclosure. The high-pass sampling circuit 40 shown in FIG. 4 is different from the act-based sampling circuits 600, 601, and 602 shown in FIGS. 6A-6C, respectively, in a point that two or three detection blocks (e.g., the filter stage 62A and the filter stage 62B of FIG. 6A, the filter stage type A 64A and the filter stage type B 64B of FIG. 6B, and the filter stage 62A, the filter stage type A 64A, and the filter stage type B 64B of FIG. 6C).

In the multi-stage, act-based sampling circuit 600 of FIG. 6A, the filter stage 62A is a circuit block is a circuit which intermittently monitors the access responding to the Pre-Pulse signal by using the first sampling signal S1 provided by the random sampler 61 and, if occurrence of the access of a predetermined number of times with respect to the same word line WL within a predetermined period of time is detected, activates the second sampling signal S2.

Except that the second sampling signal S2 is used instead of the first sampling signal S1, the filter stage 62B has the same circuit configuration as the filter stage 62A. The filter stage 62B monitors the access responding to the second sampling signal S2 and, if occurrence of the access of a predetermined number of times with respect to the same word line WL within a predetermined period of time is detected, activates a third sampling signal S3. The third sampling signal S3 is supplied to a driver. As a result, when the third sampling signal S3 is activated, which may be used to determine the driver circuit 63. According to such a configuration, only the row address XADD to which the frequency of access is a high frequency is selected for refresh. Therefore, the probability of carrying out a wasteful refresh operation with respect to the memory cell MC, which does not require an additional refresh operation, can be reduced.

In the multi-stage, act-based sampling circuit 601 of FIG. 6B, the filter stage type A 64A and the filter stage type B 64B are circuit blocks that operate in parallel (e.g., rather than serially as shown in FIG. 6A) in response to the PrePulse signal by using the first sampling signal S1 provided by the random sampler 61 and, each circuit uses different filter type to determine if an occurrence of a access of a respective predetermined number of times with respect to the same word line WL within a predetermined period of time is detected, activates a respective second sampling signal S2A and S2B.

The second sampling signals S2A and S2B are passed through a logic circuit (e.g., a NOR gate 65 and an inverter 66) to provide the Sample2 signal. Thus, the Sample2 signal is set when either one of the sampling S2A and the sampling signal S2B is active. According to such a configuration, only the row address XADD to which the frequency of access is a high frequency is selected for refresh. Therefore, the probability of carrying out a wasteful refresh operation with respect to the memory cell MC, which does not require an additional refresh operation, can be reduced.

The multi-stage, act-based sampling circuit 602 of FIG. 6C is a combination of the multi-stage, act-based sampling circuit 600 of FIG. 6A and the multi-stage, act-based sampling circuit 601 of FIG. 6B. In the multi-stage, act-based sampling circuit 602, the filter stage 62A is a circuit block is a circuit which intermittently monitors the access responding to the PrePulse signal by using the first sampling signal S1 provided by the random sampler 61 and, if occurrence of the access of a predetermined number of times with respect to the same word line WL within a predetermined period of time is detected, activates the second sampling signal S2.

The filter stage type A 64A and the filter stage type B 64B are circuit blocks that operate in parallel in response to the S2 signal and, each circuit uses different filter type to determine if an occurrence of a access of a respective predetermined number of times with respect to the same word line WL within a predetermined period of time is detected, activates a respective second sampling signal S3A and S3B.

The second sampling signals S3A and S3B are passed through a logic circuit (e.g., a NOR gate 65 and an inverter 66) to provide the Sample2 signal. Thus, the Sample2 signal is set when either one of the sampling S3A and the sampling signal S3B is active. According to such a configuration, only the row address XADD to which the frequency of access is a high frequency is selected for refresh. Therefore, the probability of carrying out a wasteful refresh operation with respect to the memory cell MC, which does not require an additional refresh operation, can be reduced.

The filter stage 62A, the filter stage 62B, the filter stage type A 64A, and the filter stage type B 64B of FIGS. 6A-6C the may each implement one of the high-pass sampling circuit 40 of FIG. 4, the bandpass sampling circuit 50A of FIG. 5A, or the bandpass sampling circuit 50B of FIG. 5B. For example, the filter stage 62A may implement the high-pass sampling circuit 40 of FIG. 4 and the filter stage 62B may implement one of the bandpass sampling circuits 50A or 50B of FIGS. 5A and 5B. In another example, the filter stage type A 64A may implement one of the bandpass sampling circuits 50A or 50B of FIGS. 5A and 5B and the filter stage type B 64B may implement the high-pass sampling circuit 40 of FIG. 4. In yet another example, the filter stage type A 64A may implement the high-pass sampling circuit 40 of FIG. 4 and the filter stage type B 64B may implement one of the bandpass sampling circuits 50A or 50B of FIGS. 5A and 5B. In yet another example, both of the filter stages 62A and 62B may implement the high-pass sampling circuit 40 of FIG. 4 or one or one each of the bandpass sampling circuits 50A and 50B of FIGS. 5A and 5B. Other combinations may be implemented without departing from the scope of the disclosure.

Logic levels of signals, types of transistors, types of data input circuits used in the embodiments described the above are merely examples. However, in other embodiments, combinations of the logic levels of signals, types of transistors, types of data input circuits other than those specifically described in the disclosure may be used without departing from the scope of the disclosure.

Although various embodiments of the disclosure have been disclosed in the context of certain embodiments and examples, it will be understood by those skilled in the art that disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the disclosure should not be limited by the particular disclosed embodiments described above.

What is claimed is:

1. An apparatus comprising:
   a row hammer control circuit configured to provide a row hammer address; and
   a refresh control circuit configured to perform a row hammer refresh operation on an address of a memory array related to the row hammer address;
   wherein the row hammer control circuit comprises:
   a plurality of first latch circuits, each of the plurality of first latch circuits being configured to store an old row address that was used to access the memory array;
   a plurality of second latch circuits provided correspondingly to the plurality of first latch circuits, each of the plurality of second latch circuits being set to one of first and second states, the first state indicating that the old row address stored in a corresponding one of the plurality of first latch circuits is valid; and
   a sample signal generator configured to assert a sample signal when a new row address to be used to access the memory array matches the old row address stored in any one of the plurality of first latch circuits that is indicated as being valid by the first state of a corresponding one of the plurality of second latch circuits.

2. The apparatus of claim 1, wherein the sample signal generator is further configured not to assert the sample signal when an additional new row address to be used to access the memory array matches the old row address stored in any one of the plurality of first latch circuits that is indicated as being invalid by the second state of a corresponding one of the plurality of second latch circuits.

3. The apparatus of claim 2, wherein the plurality of first latch circuits are coupled in series to each other such that a first one of the plurality of first latch circuits is further configured to receive the new row address and the plurality of second latch circuits are coupled in series to each other;
   wherein the first one of the plurality of second latch circuits provided correspondingly to the first one of the plurality of first latch circuits is further configured to be set to the first state when the first one of the plurality of first latch circuits stores the additional new row address therein.

4. The apparatus of claim 3, wherein the first one of the plurality of second latch circuits is further configured to be set to the first state in detection that the additional new row address does not match the old row address stored in each of the plurality of first latch circuits.

5. The apparatus of claim 3, wherein the first one of the plurality of second latch circuits is further configured to be set to the first state in detection that the additional new row address does not match the old row address stored in each of the plurality of first latch circuits when an enable signal is not asserted; and
   wherein the first one of the plurality of second latch circuits is further configured to be set to the first state regardless of the detection when the enable signal is asserted.

6. The apparatus of claim 3, wherein the first one of the plurality of second latch circuits is further configured to be set to the first state in detection that the additional new row address does not match the old row address stored in each of the plurality of first latch circuits when an enable signal is not asserted; and
   wherein the first one of the plurality of second latch circuits is further configured to be set to the first state in detection that the additional new row address does not match the old row address stored in a specified one of the plurality of first latch circuits when an enable circuit outputs the enable signal.

7. The apparatus of claim 1, wherein the sample signal generator is further configured not to assert the sample signal when a further additional new row address to be used to access the memory array does not match the old row address stored in any one of the plurality of first latch circuits.

8. The apparatus of claim 1, wherein the plurality of first latch circuits are coupled in series to each other such that a first one of the plurality of first latch circuits is further configured to receive the new row address and the plurality of second latch circuits are coupled in series to each other;
   wherein the first one of the plurality of second latch circuits provided correspondingly to the first one of the plurality of first latch circuits is further configured to be set to the second state when the first one of the plurality of first latch circuits stores the new row address therein.

9. A method comprising:
   responsive to a first sampling signal that is set based on an activation signal at a row hammer control circuit:
   latching a received row address;
   comparing the received row address with latched previously received row addresses at a row hammer control circuit;
   responsive to a match between the received row address and a previously-received row address of the latched previously received row addresses, determining whether the previously received row address has a valid state or an invalid state; and
   responsive to the previously-received row address having the valid state, asserting a sample signal to indicate detection of a row hammer attack.

10. The method of claim 9, further comprising, responsive to the match between the received row address and the previously-received row address of the latched previously received row addresses, latching the invalid state associated with the previously received row address of the latched previously received row addresses.

11. The method of claim 9, further comprising, responsive to no match between the received row address and the previously-received row address of the latched previously received row addresses, latching the valid state associated with the previously received row address of the latched previously received row addresses.

12. The method of claim 9, further comprising, responsive to the match between the received row address and the previously-received row address of the latched previously received row addresses:
   latching the valid state associated with the previously received row address of the latched previously received row addresses when an enable signal is asserted based on a randomized output from a linear feedback shift register; and
   latching the invalid state associated with the previously received row address of the latched previously received row addresses when the enable signal is de-asserted based on the randomized output from the linear feedback shift register.

13. The method of claim 9, wherein latching the received row address comprises shifting the latched previously received row addresses in a shift register to latch the received row address.

* * * * *